United States Patent
Someya

[11] Patent Number: 5,883,700
[45] Date of Patent: Mar. 16, 1999

[54] METHOD FOR PROJECTION EXPOSURE TO LIGHT

[75] Inventor: Atsushi Someya, Kanagawa, Japan

[73] Assignee: Sony Corporation, Tokyo, Japan

[21] Appl. No.: 563,091

[22] Filed: Nov. 27, 1995

[30] Foreign Application Priority Data

Nov. 28, 1994  [JP]  Japan .................................. 6-293468

[51] Int. Cl.$^6$ .......................... G03B 27/42; G03B 27/52; G03B 27/54; G03B 27/32
[52] U.S. Cl. ................................ 355/53; 355/55; 355/67; 355/77
[58] Field of Search ................................ 355/53, 77, 55; 250/548; 356/400, 401, 363, 375

[56] References Cited

U.S. PATENT DOCUMENTS

| | | | |
|---|---|---|---|
| 4,688,932 | 8/1987 | Suzuki ..................................... | 355/51 |
| 4,869,999 | 9/1989 | Fukuda et al. ........................... | 430/311 |
| 4,924,257 | 5/1990 | Jain .......................................... | 355/53 |
| 5,117,255 | 5/1992 | Shiraishi et al. .......................... | 355/53 |
| 5,194,893 | 3/1993 | Nishi ......................................... | 355/53 |
| 5,473,409 | 12/1995 | Takeda et al. ............................ | 355/53 |
| 5,528,027 | 6/1996 | Mizutani ................................... | 250/234 |

*Primary Examiner*—Richard Moses
*Assistant Examiner*—Shival Virmani
*Attorney, Agent, or Firm*—Hill & Simpson

[57] ABSTRACT

A method and apparatus for projection exposure applied to photolithography in the field of production of semiconductor devices. An illuminating light which has passed through a slit having an opening width is swept relative to a photomask for projecting a pattern of the photomask on a wafer using a projection optical system. As the illuminating light is swept a distance equal to the opening width of the slit in a direction along the x-axis, the imaging plane is oscillated by one period a distance equal to 2 μm. Specifically, during the time the photomask is moved by the above distance in the direction along the axis x, with the illuminating unit and the projection optical system remaining fixed, the wafer is moved in the x-axis direction in synchronism with the photomask 4 at the same time as the wafer is oscillated by one period with an amplitude 2 μm in the direction along the z-axis. The FLEX method may be applied to the projection exposure of the step-and-scan system such that enlargement of the exposure area and the depth of focus may be achieved simultaneously. Thus, in the process for manufacturing a semiconductor device which is miniaturized in size, the photolithographic process can be improved in reliability.

7 Claims, 3 Drawing Sheets

METHOD FOR PROJECTION EXPOSURE TO LIGHT

BACKGROUND OF THE INVENTION

The present invention relates to a method for projection exposure applied to photolithography in the field of semiconductor manufacturing. More particularly, it relates to a method in which projection exposure to light of the step-and-scan system is performed while assuring a sufficient depth of focus.

In the field of production of semiconductor devices, 16 MDRAMs in accordance with the design rule of a half-micron (0.5 μm) have already begun to be mass-produced, whereas, as the laboratory work, researches into processing for a sub-half-micron size (up to 0.35 μm) required for the 64 MDRAM of the next generation and for a quarter-micron size (0.25 μm) required for the 256 MDRAM of the next-to-next generation are proceeding. The key technology for the progress in such micro-size processing is photolithography. Past progress in the technology owes much to reduction of the exposing wavelength and high numerical aperture (NA) of a contracting projection lens in a contracting projection exposure device (stepper). The reduction in wavelength and the high NA impose non-meritorious conditions in increasing the depth of focus (DOF) since the DOF is proportional to the exposing wavelength λ and inversely proportional to the square of the numerical aperture NA.

On the other hand, the surface step difference of a semiconductor wafer, as an object to be exposed to light, tends to be increased year by year in keeping with high integration density of the semiconductor integrated circuit. The reason is that, under the current tendency towards three-dimensional device structure, contraction in the three-dimensional direction is not so significant as that in the two-dimensional direction due to necessity in maintaining the performance and reliability of the integrated circuit. If a photoresist material is coated on the surface of a semiconductor wafer having such significant step difference, larger surface step difference or variations in the film thickness are produced on the photoresist layer. On the other hand, the imaging surface cannot be perfectly smooth due to the presence of distortions in the imaging surface, while the substrate surface is slightly tilted from a surface which is perfectly normal to the optical axis of the projection optical system. These factors render difficult the uniform light exposure of the entire wafer in the sole imaging plane.

For overcoming the above problems, several techniques have been proposed in which artifices are used in the methods for exploiting the light exposure device for achieving high contrast and high resolution while maintaining the NA in the projection optical system at a pre-set level and also maintaining the DOF at a practical level.

One of these techniques is the focus latitude enhancement exposure (FLEX) method. This technique resides in carrying out light exposure a plurality of times at the same light exposure position via the same photomask as the imaging surface is shifted for maintaining optical image contrast for an effectively long distance along the optical axis, as disclosed in JP Patent Kokai Publication JP-A-58-17446 (1983). With this technique, at least one of the photomask, wafer and the projection optical system is subjected to wobbling of small amplitudes along the optical axis for shifting the imaging surface. There is also disclosed in e.g., JP Patent Kokai Publication JP-A-63-64037 (1988) a method for shifting the imaging surface by shifting these components stepwise or continuously for each light exposure.

It is up to the device for projection exposure to light to deal with a variety of requirements in addition to the requirement for increasing the DOF. For example, it is required that the device for projection exposure enlarge an area exposed to light by one light exposure operation, that is an exposed area, for handling an increase in chip size brought about by further increases in the integration of semiconductor integrated circuits.

With the conventional step-and-repeat systems for light exposure, in which an exposure area comprising a single chip is exposed at a single time to light and the exposed area is shifted in succession on the substrate, it is necessary to increase the diameter of the projection lens for increasing the exposure area. However, it is extremely difficult, both technically and economically cost, to produce a large-diameter lens free of aberrations.

Thus it has been envisaged to combat the above problem by carrying out light exposure while scanning a beam spot of the illuminating light without exposing a sole exposure area at a time. This system, termed a step-and-scan system, effects light exposure of the wafer with a beam spot from a light source which has passed through a slit and which has a spot area smaller than the area of the photomask. In practice, the photomask and the wafer are moved in the in-plane direction in synchronism with each other while the illuminating optical system and the projection optical system remain stationary.

If this step-and-scan system is applied, the exposure area may be enlarged without the necessity of increasing the diameter of the projection lens.

Meanwhile, the above-described step-and-scan system, while coping with the increases chip size, cannot sufficiently cope with the requirement of increasing the depth of focus (DOF).

OBJECT AND SUMMARY OF THE INVENTION

It is therefore an object of the present invention to provide a method for projection exposure whereby projection exposure of the step-and-scan system can be carried out while maintaining sufficient DOF.

According to the present invention, there is provided a method for projecting a mask pattern on a substrate by light exposure through a photomask, including the steps of placing a photomask having the mask pattern for facing the substrate, illuminating an exposing light via the photomask on the substrate, so that the exposing light has an illuminating area smaller in width than an intended light exposing area on the substrate, and moving an image of the mask pattern formed by illumination of the exposing light on the substrate simultaneously with the illuminating step. The illuminating step and movement step are carried out so that a plurality of the imaging surfaces exist for an optional light exposing point on the substrate.

Thus the present invention resides in a method and apparatus for projection exposure consisting in the application of the FLEX method to the step-and-scan system for enlarging both the light exposure area and the DOF.

The above-mentioned light exposure with plural imaging planes may be achieved by carrying out scanning operations with individually set imaging planes a plurality of numbers of times. For example, for light exposure with two imaging planes, a first light exposure operation is carried out by scanning with a pre-set imaging plane and a second light exposure operation is carried out by scanning with a pre-set imaging plane different from the imaging plane for the first light exposure operation so that light exposure is carried out twice for the same point on the substrate.

The light exposure with plural imaging planes may be achieved by carrying out scanning once as the imaging plane is oscillated periodically in a direction along the optical axis. Such periodic oscillation is preferably carried out at least once during the time the scanning over a distance equal to the opening width of the slit is carried out so that light exposure is carried out at all positions in the range of oscillations of the imaging plane at all points of light exposure.

The scanning may be carried out in a plane normal to the optical axis by synchronized movement of the substrate and the photomask. The plural imaging planes may be individually set or periodically oscillated by moving the substrate in a direction along the optical axis. For achieving light exposure with plural imaging planes by a sole scanning operation, it suffices to cause the substrate to perform a movement consisting in synthesis of the movement n a plane normal to the optical axis and the periodic movement along the optical axis.

According to the present invention, the FLEX method may be applied to the projection exposure of the step and scan system, so that enlargement of the DOF and that of the area of light exposure may be achieved simultaneously.

If light exposure with plural imaging planes is carried out by carrying out scanning operations with individually set imaging planes a plurality of number of times, the routinely employed projection exposure device of the step-and-scan system may be directly employed for enlarging the DOF.

If the scanning is performed as the imaging plane is periodically oscillated in a direction along the optical axis, light exposure with plural imaging planes may be performed by a sole scanning operation for an optional point on the substrate, thus preventing throughput from being deteriorated while also preventing resolution from being lowered due to pattern misregistration.

If, during the time the scanning is performed over a distance equal to the opening width of the slit, the imaging plane is oscillated at least one period, the imaging plane can be oscillated at least by one period during the time the light exposure is carried out on an optional point on the substrate. Thus it becomes possible to effect light exposure at all points in the range of change of the imaging plane thus realizing uniform light exposure in the substrate.

The step-and-repeat projection exposure may be easily realized by moving the substrate and the photomask in the respective in-plane directions in synchronism with each other. If the substrate is additionally moved in a direction along the optical axis, the FLEX method may be applied easily. Thus the light exposure with plural imaging planes may be achieved with a single scanning operation if the substrate is caused to perform a movement synthesized from an in-plane movement normal to the optical axis and a periodic movement in a direction along the optical axis.

DETAILED DESCRIPTION OF THE EMBODIMENTS

Figure 1:
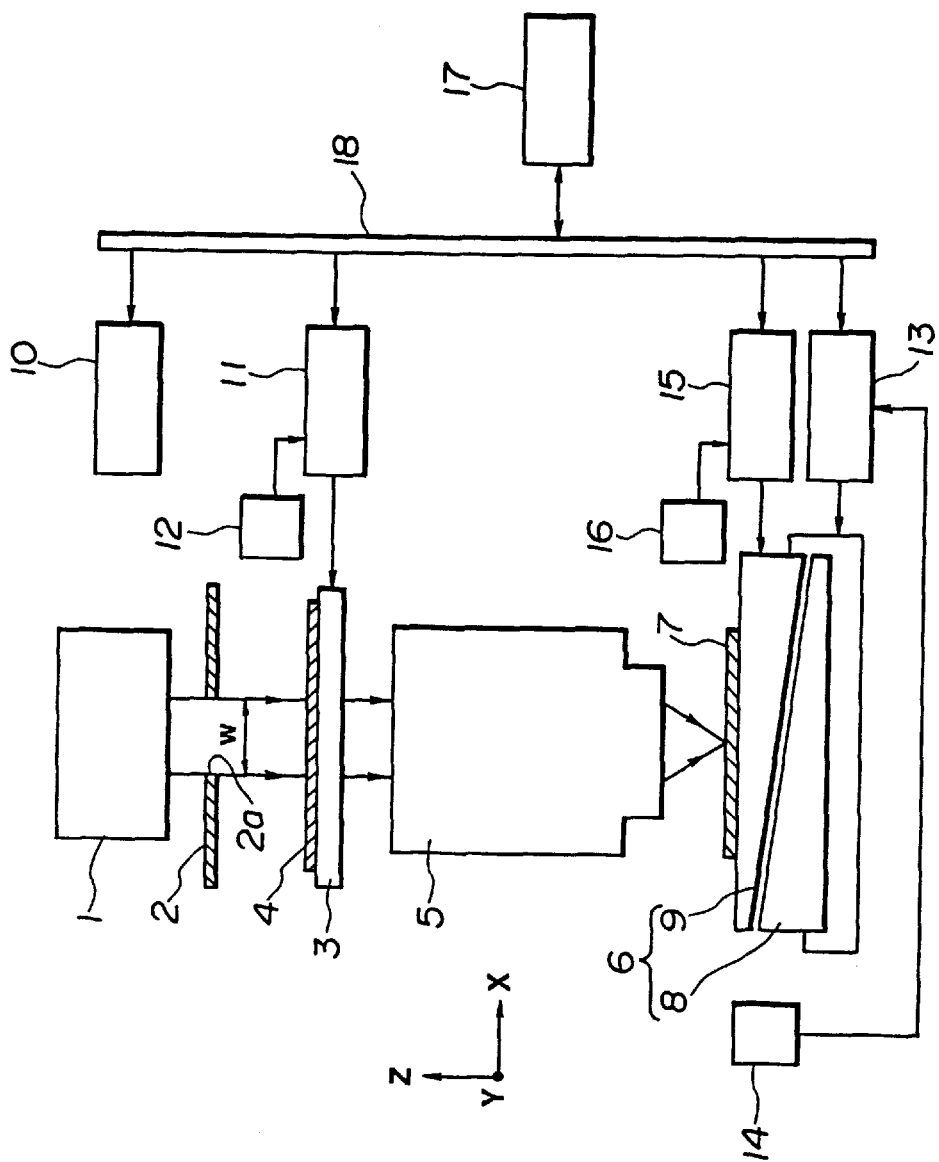
FIG. 1 a schematic view showing a structural example of a projection exposure device of the step-and-scan system according to the present invention.
Figure 2:
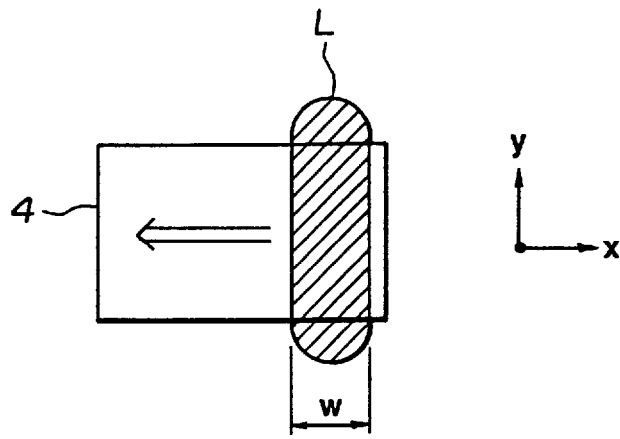
FIG. 2 is a schematic view showing a photomask and an illuminating light L scanning the photomask in the projection exposure according to the present invention.

Referring to the drawings, the method for projection exposure according to the present invention will be explained in detail.

FIG. 1 shows a schematic arrangement of a device for projection exposure of the step-and-scan system employed in the present embodiment. With the present projection exposure system, an i-beam from a mercury lamp, not shown, is converted into a collimated light beam and radiated from an illuminating unit 1. The collimated light is passed via a slit 2 through a photomask 4 placed on a photomask stage 3, so that a pattern of the photomask 4 is projected to a contracted size via a projection optical system 5 on a wafer 7 placed on a wafer stage 6.

With the above projection exposure device, the illuminating unit 1, slit 2 and the projection optical system 5 are fixed, while the photomask stage 3 is movable along the x-axis. An opening 2a of the slit 2 has a width in a direction along the y-axis (in the direction normal to the drawing sheet) with a width slightly larger than the size along the y-axis of the photomask 4, while having a width w along the x-axis narrower than the size along the x-axis of the photomask 4. Thus, if the photomask stage 3 is driven for moving the photomask 4 in the plus (+) direction along the x-axis, the illuminating light L of the width w, which has passed through the slit 2, is swept on the photomask 4 in the minus (−) direction on the photomask 4.

The wafer stage 6 is made up of an xy-stage 8 for shifting the wafer 7 in the xy-plane and a z-stage 9 for shifting the wafer along the z-axis. The wafer stage 6 enables the wafer 7 to be three-dimensionally moved to a designated position by the combined movements of the stages 8 and 9.

During exposure, the xy-stage 8 is moved along the x-axis for moving the wafer 7 in synchronism with the photomask 4. After the end of the exposure, the xy-stage 8 is moved to a pre-set position in the xy-plane for effecting similar exposure for a different area of the wafer 7. On the other hand, if the z-stage 9 is moved during exposure, it becomes possible to change the relative position between the focal plane of the image projected from the projection optical system 5 and the wafer surface, that is to change the imaging plane. In the explanation to follow, the focal plane is defined as z=0 and a mean vertical position of step differences of the photoresist coating film on the surface of the wafer 7 is defined as a wafer surface or plane. The direction of approaching the wafer plane to the projection optical system 5 is defined as the z-axis (+) direction.

The above projection exposure device includes a shutter control system 10 for controlling the exposure timing, a photomask control system 11 for driving the photomask stage 3 to its designated position, an xy-control system 13 for driving the xy-stage 8 of the wafer stage 6 to its designated position, and a z-control system 15 for driving the z-stage 9 to its designated position. To the photomask control system 11, xy-control system 13 and the z-control system 15, there are respectively connected a photomask sensor 12 for detecting the position of the photomask 4 relative to the slit 2 along the x-axis, an xy-sensor 14 for detecting the position of the wafer 7 relative to the slit 2 within the xy-plane and a z-sensor 16 for detecting the position of the wafer 7 relative to the focal plane along the z-axis direction. The control systems 10, 11, 13 and 15 are connected via a busline 18 to a computer 17 managing control of the projection exposure device in its entirety.

The computer 17 pre-stores therein e.g., the light exposure position in the xy-plane on the wafer 7, position of the z-stage 9 and the amount of light exposure. The control systems 10, 11, 13 and 15 are designed to receive various signals generated on the basis of this information via busline 18 to execute pre-set operations.

The computer 17 also stores therein a movement velocity of the photomask stage 3 along the x-axis and the "amount of movement of the xy-stage 8 along the x-axis" relative to the "amount of movement of the photomask stage 3 along the x-axis". Based upon the signals derived from this information, the photomask control system 11 and the xy-control system 13 move the photomask 4 and the wafer 7 along the x-axis in synchronism with each other, respectively. For example, if the projection exposure system 5 effects contracting projection with a contraction ratio of 1/5, the xy-stage 8 is moved one-fifth the amount of movement of the photomask stage 3 along the x-axis in synchronism with the photomask stage 3.

Since the information concerning the position of the photomask stage 3 relative to the slit 2 along the x-axis and the relative position of the xy-stage 3 relative to the slit 2 along the x-axis is perpetually fed back from the photomask sensor 12 and the xy-sensor 14 to the photomask control system 11 and the xy-control system 13, should there be produced any deviation in the "amount of movement of the xy-stage 8 along the x-axis" relative to the "amount of movement of the photomask stage 3 along the x-axis", such deviation may be corrected by driving the x,y-stage 8.

Thus, if light exposure is carried out as the photomask 4 and the wafer 7 are moved in the x-axis direction in synchronism with each other, an area of a pattern of the photomask 4 irradiated with the illuminating light L may be continuously projected on a corresponding area of the wafer 7, as the illuminating light L with a width w sweeps the photomask 4, thus achieving the so-called step-and-scan projection exposure.

EMBODIMENT 1

In the present Embodiment 1, an example of effecting light exposure in two different imaging surfaces using the above-described projection light exposure device is explained.

Figure 3:
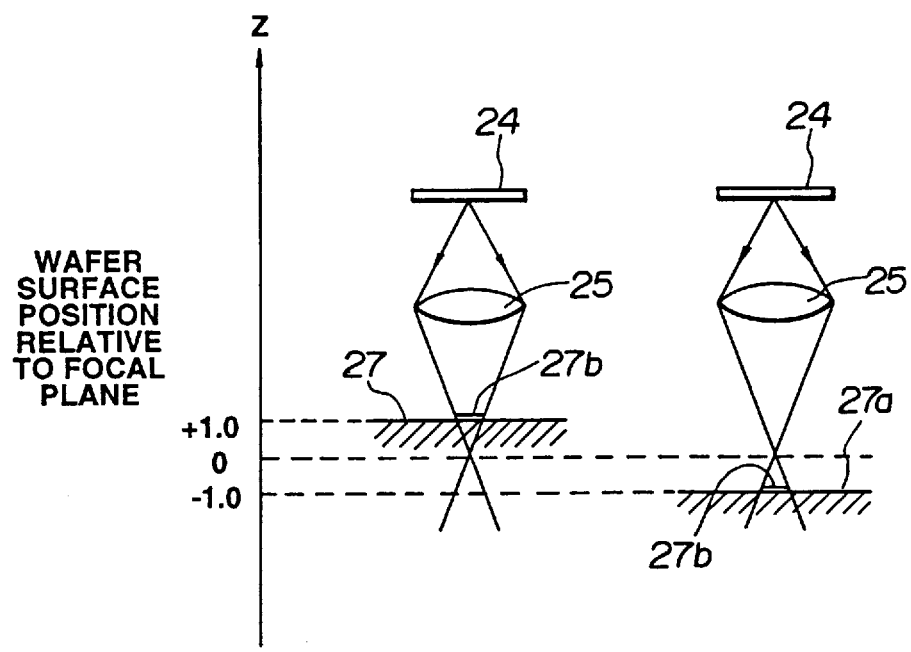
FIG. 3 is a schematic view showing the position of a wafer surface in ca application of a two-stage FLEX method.

For producing two different imaging surfaces, it suffices to set a wafer surface 27a at two positions of e.g., +1.0 $\mu$m and -0.1 $\mu$m with respect to the focal plane (z=0) of light which has passed through the photomask 24 and the projection lens 25 in the projection optical system, as shown in FIG. 3 showing essential portions of the projection exposure device. 27b is a part image of the mask pattern.

In the projection device of FIG. 1, the z-stage 9 was driven so that the wafer surface is at +1.0 $\mu$m, and subsequently the illuminating light L was started to be illuminated on the photomask 4. The photomask stage 3 was driven to x-axis plus (+), while the xy-stage 8 was driven along the x-axis in timed relation thereto. After the photomask stage 3 and the xy-stage 8 were moved a pre-set distance and the totality of the pre-set pattern of the photomask 4 was projected on the wafer 7, illumination of the illuminating light L was terminated. The start/stop of the irradiation of the illuminating light L was performed by driving the shutter control system 10.

Then, after driving the z-stage 9 so that the wafer surface is at -1.0 $\mu$m, the illumination of the illuminating light L was again started. The photomask stage 3 was driven to x-axis plus (+), while the xy-stage 8 was driven along the x-axis in timed relation thereto. After moving the photomask stage 3 and the xy-stage 8 to a position which persisted prior to the first light exposure, the totality of the pre-set pattern of the photomask 4 was again projected at the same position on the wafer 7. The irradiation of the illuminating light L was then terminated.

In this manner, the same point on the wafer 7 was exposed to light at two different imaging surfaces, as the illuminating light L was reciprocated with respect to the photomask 4.

Thus, by application of the method for projection exposure of the instant embodiment, projection exposure may be achieved in accordance with the step-and-scan system, as the depth of focus is enlarged.

EMBODIMENT 2

In the present embodiment, an example of periodically changing the imaging surface while the photomask 4 is moved a distance w along the x-axis is explained.

That is, in the projection exposure device shown in FIG. 1, the "amount of movement of the z-stage 9 along the z-axis" relative to the "amount of movement of the photomask stage 3 along the x-axis" was stored in the computer 17 so that the wafer 7 was oscillated in the z-axis by one period during the time the photomask 4 was moved in the x-axis direction a distance equal to the width w of the opening 2a of the slit 2. Meanwhile, by perpetually feeding back the information on the relative position of the photomask stage 3 in the z-axis direction and the relative position of the z-stage 9 in the z-axis direction from the photomask sensor 12 and the z-sensor 16 to the photomask control system 11 and to the z-control system, any deviation in the "amount of movement of the z-stage 9 along the z-axis" relative to the "amount of movement of the photomask stage 3 along the x-axis" could be corrected by driving the z-stage 9, if any such deviation is produced.

It is noted that the amount of light exposure was set so as to be constant at al times, while the amplitude of the z-stage 9 was set to 2.0 $\mu$m.

For actual projection exposure, the irradiation of the illuminating light L on the photomask 4 was started after setting the photomask stage 3, xy-stage 8 and the z-stage 9 at pre-set positions. The photomask stage 3 was driven to the x-axis (+), while the xy-stage 8 was moved in the x-axis direction in timed relation thereto. After the photomask stage 3 and the xy-stage 8 were moved a pre-set amount along the x-axis, and the totality of the pre-set pattern of the photomask 4 was projected on the wafer 7, the irradiation of the illuminating light was terminated.

Figure 4:
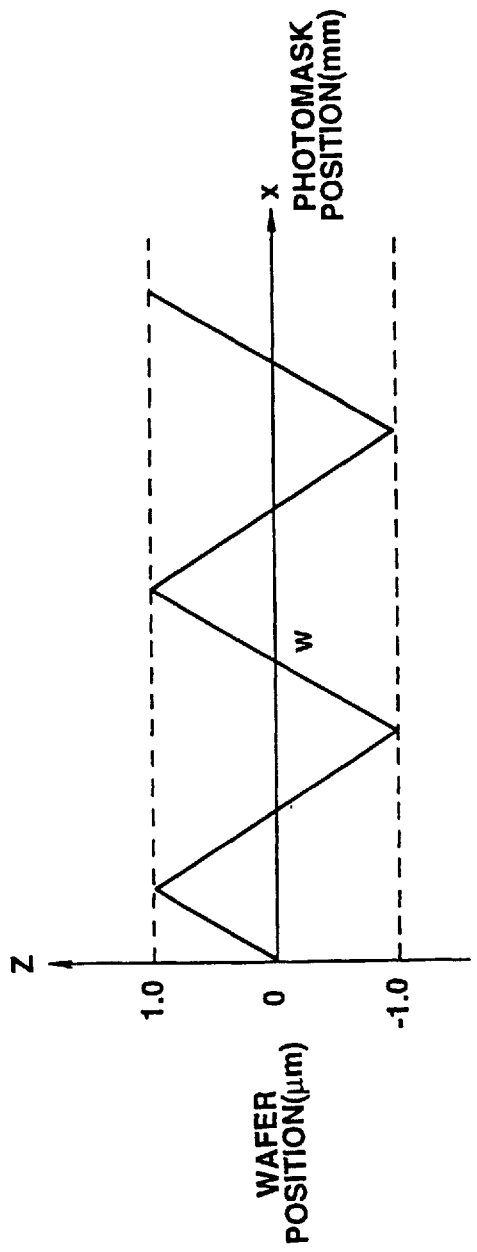
FIG. 4 is a graph showing the relation between the photomask position and the wafer surface.

FIG. 4 shows the relation of the position of the wafer surface in the z-axis direction (vertical axis) with respect to the position of the photomask 4 in the x-axis direction (horizontal axis). The position on the horizontal axis where an edge of the pattern of the photomask 4 starts to be superposed with the irradiation region of the irradiating light L is a position for x=0. The vertical axis represents the position of the wafer surface relative to the focal plane (z=0).

That is, since the edge of the pattern of the photomask 4 starts to travel-in the illumination area of the illuminating light L until it has passed through the illumination area, the wafer surface performed an oscillating movement, in such a manner that the wafer surface was moved from the focal plane to +1.0 $\mu$m, returned to the focal plane, moved from the focal plane to -1.0 $\mu$m and again returned to the focal plane, while the photomask 4 was moved a distance corresponding to first w/4, a distance corresponding to second w/4, a distance corresponding to third w/4 and a distance corresponding to the last w/4, respectively.

Thus the light exposure to the wafer 7 could be achieved as the imaging surface was moved by one period with an amplitude of 2.0 μm while the illuminating light L was swept a distance equal to w.

Thus, with the projection exposure of the instant embodiment, light exposure is achieved for all imaging lanes for any light exposure points of the wafer 7, thus assuring enlargement of the depth of focus. In addition, since only one light exposure operation suffices, the throughput is improved as compared to that in the embodiment 1. Besides, patten misregistration may be prohibited from occurring, thus improving resolution.

Although preferred embodiments of the method for projection exposure according to the present invention has been described as above, the present invention is not limited to these embodiments. For example, although the direction of movement of the photomask 4 and the wafer 7 is reversed in the embodiment 1 for the first and second light exposing operations, it is also possible to restore the photomask 4 and the wafer 7 to the position which prevailed prior to starting of the first light exposure operation, after the end of the first light exposure operation, and to shift the photomask 4 and the wafer 7 for the second light exposing operation in the same direction as that for the first light exposing operation.

In the embodiment 2, the "amount of movement of the z-stage 9" relative to the "amount of movement of the photomask stage 3" may be changed so that the movement velocity of the z-stage 9 becomes slow in the vicinity of the maximal and minimal value positions of the wafer surface. Alternatively, the imaging surface may be changed by more than two periods during the time when the photomask 4 is moved a distance equal to w.

Also, in the embodiment 2, the "amount of movement of the z-stage 9 along the z-axis" relative to the "amount of movement of the photomask stage 3 along the x-axis" is stored in the computer 17 for synchronizing the amount of movement of the photomask stage 3 along the x-axis to the amount of movement of the z-stage 9 along the z-axis. However, since the movement of the photomask stage 3 in the x-axis direction is synchronized with the movement of the xy-stage 8 in the x-axis direction, it is possible to store "the amount of movement of the z-stage 9 in the z-axis direction" with respect to the "amount of movement of the xy-stage 8 in the x-axis direction" in the computer 17.

Although the i-ray, as the bright line of a mercury lamp, is used as the illuminating light L, it is also possible to use a g-ray as the bright line of a mercury lamp or an excimer laser light such as KrF or ArF. If the excimer laser light is employed, since the illuminating light L is oscillated in pulses, the shutter control system 10 in FIG. 1 may be eliminated.

What is claimed is:

1. A method for projecting a mask pattern on a substrate by light exposure through a photomask, comprising the steps of:

providing a photomask having the mask pattern;

illuminating an exposing light through said photomask onto said substrate, said exposing light having an illuminating area on said substrate; and effecting relative movement of said illuminating area with respect to said substrate in a direction normal to the optical axis simultaneously with said illuminating step as the image of said mask pattern by illumination of said exposing light is maintained in a constant position along the optical axis; wherein said illuminating and movement steps are carried out for at least two different imaging surfaces of said mask pattern.

2. The method as claimed in claim 1 wherein said substrate is moved along the optical axis for realizing said different imaging surfaces.

3. A method for projecting a mask pattern on a substrate by light exposure through a photomask, comprising the steps of:

providing a photomask having the mask pattern;

illuminating an exposing light via said photomask on said substrate, said exposing light having an illuminating area;

moving said illuminating area in a direction normal to the optical axis with respect to the said substrate; and changing an imaging surface of said mask pattern formed by illumination of the exposing light from the substrate along the direction of the optical axis simultaneously with said illumination step and moving step.

4. The method as claimed in claim 3 wherein said changes of the imaging surface are achieved by moving said substrate in a direction along the optical axis.

5. The method as claimed in claim 3 wherein said changing step occurs periodically by at least one period during the time when the illuminated area is moved a distance equal to a width said illuminated area has in the direction in which said illuminated area is moved.

6. The method for projecting a mask pattern of claim 1, wherein the substrate surface is oriented to be substantially normal to the optical axis during said step of effecting relative movement.

7. The method for projecting a mask pattern of claim 3, wherein the substrate surface is oriented to be substantially normal to the optical axis during said step of changing an imaging surface.

* * * * *